(12) United States Patent
Chidambaram et al.

(10) Patent No.: US 10,134,607 B2
(45) Date of Patent: Nov. 20, 2018

(54) METHOD FOR LOW TEMPERATURE BONDING OF WAFERS

(71) Applicant: Agency for Science, Technology and Research, Singapore (SG)

(72) Inventors: Vivek Chidambaram, Singapore (SG); Sunil Wickramanayaka, Singapore (SG); Jinghui Xu, Singapore (SG); Zhipeng Ding, Singapore (SG); Li Yan Siow, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 0 days.

(21) Appl. No.: 15/321,701

(22) PCT Filed: Jul. 9, 2015

(86) PCT No.: PCT/SG2015/050206
§ 371 (c)(1),
(2) Date: Dec. 22, 2016

(87) PCT Pub. No.: WO2016/007092
PCT Pub. Date: Jan. 14, 2016

(65) Prior Publication Data
US 2017/0178929 A1   Jun. 22, 2017

(30) Foreign Application Priority Data
Jul. 9, 2014   (SG) ............................ 10201403967Q

(51) Int. Cl.
*B23K 20/02* (2006.01)
*B81C 3/00* (2006.01)
(Continued)

(52) U.S. Cl.
CPC ............ *H01L 21/50* (2013.01); *B23K 35/002* (2013.01); *H01L 23/488* (2013.01); *H01L 2924/0002* (2013.01)

(58) Field of Classification Search
CPC ..... H01L 21/7624; H01L 24/83; H01L 24/26; H01L 21/50; H01L 23/488; B23K 35/002; B23K 20/02
See application file for complete search history.

(56) References Cited

U.S. PATENT DOCUMENTS

| | | | |
|---|---|---|---|
| 2006/0151871 A1* | 7/2006 | Mehrotra | ............ H01L 23/3735 257/705 |
| 2009/0218702 A1* | 9/2009 | Beyne | ................. B81C 1/00333 257/778 |
| 2015/0353347 A1* | 12/2015 | Schelling | .............. B81B 7/0041 257/414 |

OTHER PUBLICATIONS

Crnogorac, F. et al., Low-temperature Al—Ge bonding for 3D integration, Journal of Vacuum Science & Technology B, 30(6):06FK01-1-06FK01-7, (2012).

(Continued)

*Primary Examiner* — Brian Turner
(74) *Attorney, Agent, or Firm* — Choate, Hall & Stewart LLP

(57) ABSTRACT

A method for bonding wafers is provided. The method comprises the steps of providing a first wafer having an exposed first layer, the first layer comprising a first metal; and providing a second wafer having an exposed second layer, the second layer comprising a second metal, the first metal and the second metal capable of forming a eutectic mixture having a eutectic melting temperature. The method further comprises the steps of contacting the first layer with the second layer; and applying a predetermined pressure at a predetermined temperature to form a solid-state diffusion bond between the first layer and the second layer, wherein (Continued)

the predetermined temperature is below the eutectic melting temperature.

14 Claims, 16 Drawing Sheets

(51) Int. Cl.
    *C25D 3/48*     (2006.01)
    *H01L 23/48*     (2006.01)
    *H05K 1/11*     (2006.01)
    *H01L 23/373*     (2006.01)
    *H01L 23/15*     (2006.01)
    *H01L 21/58*     (2006.01)
    *H01L 21/50*     (2006.01)
    *B23K 35/00*     (2006.01)
    *H01L 23/488*     (2006.01)

(56) References Cited

OTHER PUBLICATIONS

Chen, T.D. et al., Epilayer transfer for integration of III-V photodetectors onto a silicon platform using Au—Sn and Pd—Ge bonding, IEEE international conference on indium phosphide and related materials, 502-505 (2000).

Kuhne, S. et al., Wafer-level packaging and direct interconnection technology based on hybrid bonding and through silicon vias, Journal of Micromechanics and Microengineering, 21(8):1-7 (2011).

International Search Report for PCT/SG2015/050206, 4 pages (dated Oct. 7, 2015).

Written Opinion for PCT/SG2015/050206, 5 pages (dated Oct. 7, 2015).

\* cited by examiner

METHOD FOR LOW TEMPERATURE BONDING OF WAFERS

CROSS REFERENCE TO RELATED APPLICATIONS

The present patent application is a National Stage Entry of International Patent Application No. PCT/SG2015/050206, filed on Jul. 9 2015 , which claims priority to Singapore patent application 10201403967Q, filed on Jul. 9, 2014, the entire contents of each of which are hereby incorporated by reference herein.

TECHNICAL FIELD

The present invention relates to a method for low temperature bonding of wafers. In particular, it relates to a method for bonding wafers in temperature conditions below the eutectic melting temperature.

BACKGROUND ART

Eutectic bonding is a commonly used wafer bonding technique, which essentially involves bonding two eutectic metals to form a eutectic mixture. The fact that the two eutectic metals transform directly from solid to liquid state (or vice versa from liquid to solid state) at a specific composition and at a eutectic melting temperature, without passing a two-phase equilibrium, means that the eutectic melting temperature of the eutectic mixture can be much lower than the individual melting temperature of the two metals. This is advantageous as the bonding of the wafers can be achieved at a lower temperature which translates to lower wafer production costs.

However, the eutectic melting temperatures for most eutectic mixtures are still relatively high (more than 400° C.). Therefore, it is desirable to achieve bonding of wafers at temperatures even lower than the eutectic melting temperatures, so as to lower wafer production costs even further.

Furthermore, certain chips such as micro-electro mechanical systems (MEMS), light emitting diodes (LEDs) and bio-application devices could be temperature sensitive and exposure of these chips to high temperature conditions during bonding may result in defects. These defects include cracks of thin and fragile wafers, chip performance degradation, serious wafer/chip warpage and bonding quality degradation. Therefore, there is a need to devise a method for bonding wafers under temperature conditions even lower than the eutectic melting temperature.

Thus, what is required is a novel method for bonding wafers under low temperature conditions, or more specifically, temperature conditions below the eutectic melting temperature. Furthermore, other desirable features and characteristics will become apparent from the subsequent detailed description and the appended claims, taken in conjunction with the accompanying drawings and this background of the disclosure.

SUMMARY OF INVENTION

According to an aspect of the invention, a method for bonding wafers is described, the method comprising the steps of providing a first wafer having an exposed first layer, the first layer comprising a first metal; providing a second wafer having an exposed second layer, the second layer comprising a second metal, the first metal and the second metal capable of forming a eutectic mixture having a eutectic melting temperature. The method further comprises the steps of contacting the first layer with the second layer; and applying a predetermined pressure at a predetermined temperature to form a solid-state diffusion bond between the first layer and the second layer, wherein the predetermined temperature is below the eutectic melting temperature.

Preferably, when the first metal is not deformable under the predetermined pressure and the second wafer further comprises an irregular surface, the method further comprises the step of providing a cushioning layer on the first wafer and adjacent to the first layer, the cushioning layer comprising a soft metal, wherein a melting point of the soft metal is above the predetermined temperature, and the soft metal is deformable under the predetermined pressure to diffuse through the solid-state diffusion bond and trace the contours of the irregular surface of the second wafer.

Preferably, the first metal is germanium and the second metal is aluminum.

Preferably, the soft metal is copper or aluminum.

Preferably, the predetermined temperature is less than 400° C.

Preferably, the predetermined temperature is within a range of 250° C. and 300° C.

Preferably, the method further comprises the step of performing thermal aging after the formation of the solid-state diffusion bond.

Preferably, the predetermined pressure at the predetermined temperature is applied for any one of the following durations: 30 minutes, 60 minutes, 90 minutes and 120 minutes.

Preferably, the method further comprises the steps of sputtering the first metal on the first wafer to create the first layer and sputtering the second metal on the second wafer to create the second layer.

Preferably, the first metal and the second metal are dissimilar and the first metal and the second metal have substantially similar inter-diffusion coefficients.

According to another aspect of the invention, a wafer is described, the wafer comprising a first silicon layer and a second silicon layer; and an intermediary layer between the first silicon layer and the second silicon layer, wherein the intermediary layer comprises a solid-state diffusion bond of a first metal and a second metal.

Preferably, the second silicon layer comprises an irregular surface and the wafer further comprises a diffused layer, wherein the diffused layer comprises a deformable soft metal that traces the contours of the irregular surface of the second silicon layer.

Preferably, the first metal is germanium and the second metal is aluminum.

Preferably, the first metal and the second metal are dissimilar and the first metal and the second metal have substantially similar inter-diffusion coefficients.

Preferably, the soft metal is copper or aluminum.

According to another aspect of the invention, a method for bonding wafers and initiating getter activation is described, the method comprising the steps of providing a first wafer having an exposed first layer, the first layer comprising a first metal; providing a second wafer having an exposed second layer, the second layer comprising a second metal, the first metal and the second metal capable of forming a eutectic mixture having a eutectic melting temperature. The method further comprises the steps of providing a first TLP (transient liquid phase) layer on the first wafer; and providing a second TLP layer on the second wafer. The method further comprises the steps of initiating TLP bonding between the first TLP layer and the second TLP layer to form intermetallic compounds, and contacting the first layer with the second layer; and applying a predetermined pressure at a predetermined temperature to form a solid-state diffusion bond between the first layer and the second layer, wherein the predetermined temperature is below a melting temperature of the intermetallic compounds and the predetermined temperature is below the eutectic melting temperature.

According to another aspect of the invention, a method for stacking semiconductor devices is described, the method comprising the steps of fabricating on a surface of a first semiconductor device, connectors comprising a first metal; applying under-fill to planarize the surface of the first semiconductor device; fabricating on a surface of a second semiconductor device, connectors comprising a second metal, the first metal and the second metal capable of forming a eutectic mixture having a eutectic melting temperature. The method further comprises the steps of applying under-fill to planarize the surface of the second semiconductor device; aligning and contacting the connectors on the surface of the first semiconductor device with the connectors on the surface of the second semiconductor device; and applying a predetermined pressure at a predetermined temperature to form a solid-state diffusion bond between the connectors on the surface of the first semiconductor device and the connectors on the surface of the second semiconductor device, wherein the predetermined temperature is below the eutectic melting temperature.

Preferably, the predetermined pressure is applied using pressurized gas.

Preferably, the predetermined temperature is applied by heating the first semiconductor device and the second semiconductor device in an oven to the predetermined temperature.

Preferably, the first metal is germanium and the second metal is aluminum.

BRIEF DESCRIPTION OF DRAWINGS

The accompanying figures, where like reference numerals refer to identical or functionally similar elements throughout the separate views and which together with the detailed description below are incorporated in and form part of the specification, serve to illustrate various embodiments and to explain various principles and advantages in accordance with a present embodiment.

FIG. 11, comprising FIGS. 11A, 11B, and 11C, are cross-sectional views of the assembly after TLP bonding and low temperature Al—Ge bonding, wherein FIG. 11A depicts an assembly including with two substrates and an interposer substrate with TLP bonding and low-temperature Al—Ge bonding, FIG. 11B depicts two substrates bonded by low-temperature and low-temperature Al—Ge bonding, and FIG. 11C bonded by TLP bonding and low-temperature Al—Ge bonding.

Skilled artisans will appreciate that elements in the figures are illustrated for simplicity and clarity and have not necessarily been depicted to scale. For example, the dimensions of some of the elements in the illustrations, block diagrams or flowcharts may be exaggerated in respect to other elements to help to improve understanding of the present embodiments.

DESCRIPTION OF EMBODIMENTS

The following detailed description is merely exemplary in nature and is not intended to limit the invention or the application and uses of the invention. Furthermore, there is no intention to be bound by any theory presented in the preceding background of the invention or the following detailed description. Herein, a method for bonding wafers is presented in accordance with present embodiments of being able to bond at low temperatures. In particular, low temperature Aluminum (Al)-Germanium (Ge) bonding can be achieved at temperatures even below the eutectic melting temperature. The advantages therefore are that low temperature bonding as described herein is suitable for all MEMS devices, and particularly appropriate for temperature sensitive devices and devices having micro-scale film thickness. Further, low temperature bonding ensures better bond quality and dicing yield.

In addition, in accordance with the present embodiments, it has been realized through the addition and use of a cushioning layer, that low temperature bonding can be applied to wafers with high topography.

Further, in accordance with the present embodiments, low temperature bonding has many applications and can be combined with TLP bonding for getter activation and can be applied to multi-chip stacking.

Thus it can be seen that low temperature bonding or in particular low temperature Al—Ge bonding, in accordance with the present embodiments have the advantages of bonding at low temperatures and in particular, at temperatures below the eutectic melting temperature. While exemplary embodiments have been presented in the foregoing detailed description of the invention, it should be appreciated that a vast number of variations exist.

Figure 1:
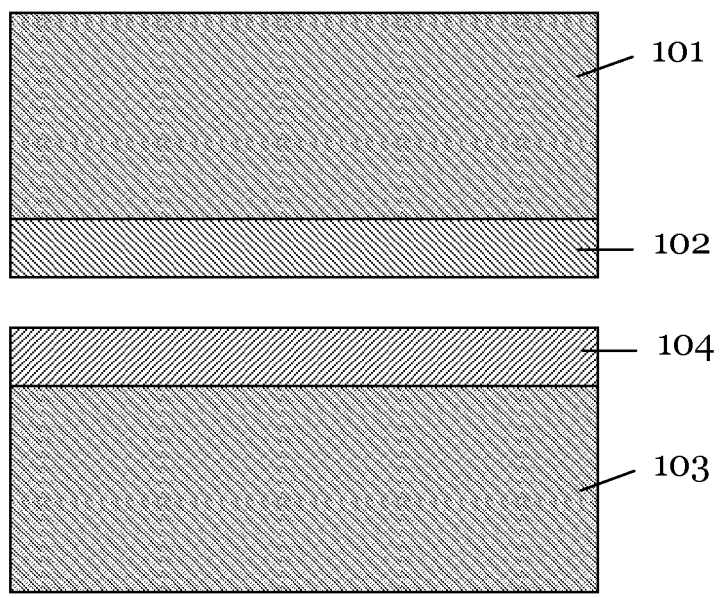
FIG. 1 is a cross-sectional view of two discrete silicon wafers just prior to bonding or assembly in accordance with an embodiment of the present invention.

FIG. 1 is a cross-sectional view of two discrete silicon wafers just prior to bonding or assembly in accordance with an embodiment of the present invention. In FIG. 1, silicon wafer 101 has an exposed layer 102. Preferably, exposed layer 102 comprises a metal. Preferably, the metal is Germanium (Ge). Preferably, the thickness of exposed layer 102 is <0.9 μm. Silicon wafer 103 in FIG. 1 has an exposed layer 104. Preferably, exposed layer 104 comprises a metal. Preferably, the metal is Aluminum (Al). Preferably, the thickness of exposed layer 104 is <1.5 μm. Preferably, the metal of exposed layer 102 and the metal of exposed layer 104 are capable of forming a eutectic mixture having a eutectic melting temperature. Preferably, exposed layer 102 and exposed layer 104 are made up of two dissimilar or non-identical metals. Preferably, the two non-identical metals have similar or substantially similar inter-diffusion kinetics or coefficients. Preferably, the difference in the inter-diffusion coefficients of the two non-identical metals should not exceed a magnitude of 1.5.

Figure 2:
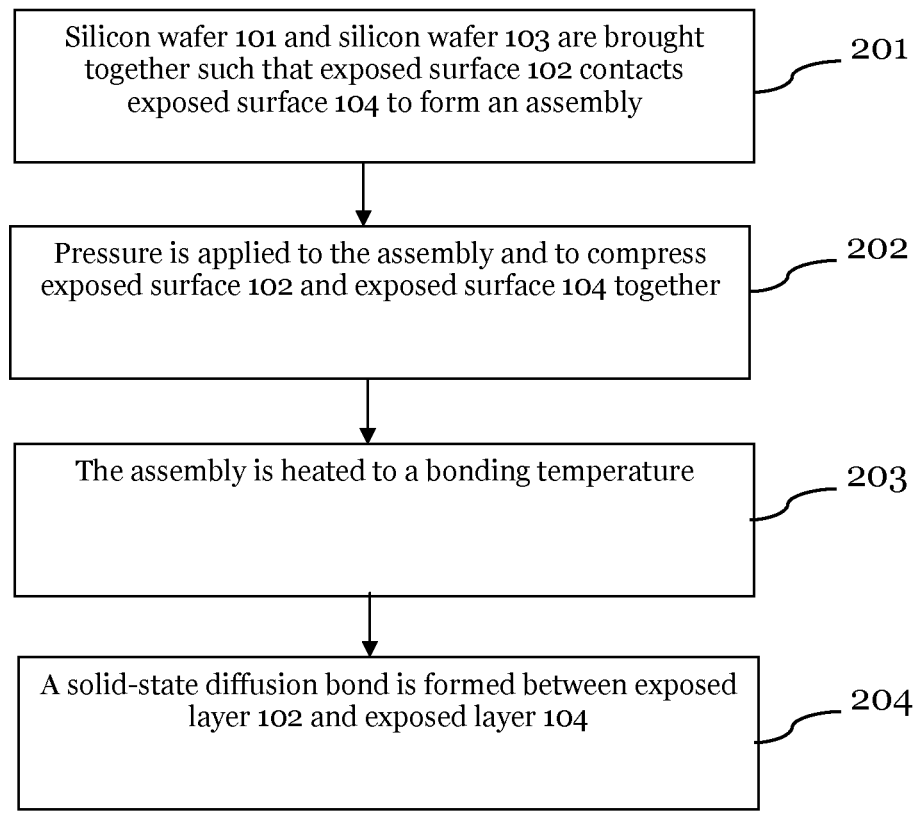
FIG. 2 is a flow chart of a method for bonding two discrete silicon wafers in accordance with an embodiment of the present invention.

FIG. 2 is a flow chart of a method for bonding two discrete silicon wafers in accordance with an embodiment of the present invention. In step 201, silicon wafer 101 and silicon wafer 103 are brought together such that exposed layer 102 contacts exposed layer 104 to form an assembly. In step 202, pressure is applied to the assembly and to compress exposed layer 102 and exposed layer 104 together. Preferably, the pressure applied is between 12 megapascals (MPa) to 18 MPa. In step 203, the assembly is heated to a bonding temperature. Preferably, the bonding temperature is below the eutectic melting temperature. Preferably, the bonding temperature is less than 400° C. Preferably, the bonding temperature is within a range of 250° C. and 300° C. In step 204, a solid-state diffusion bond is formed between exposed layer 102 and exposed layer 104. Preferably, thermal aging is performed on the assembly after the formation of the solid-state diffusion bond. Preferably, the thermal aging is performed for 30 minutes, 60 minutes, 90 minutes or 120 minutes. No thermal aging is required prior to bonding.

When exposed layer 102 comprises Ge and when exposed layer 104 comprises Al, the Al—Ge bond can be achieved at a bonding temperature below the eutectic temperature of Al and Ge, which is 423° C. The Al—Ge bond exhibits hermetic properties. However, when the bonding temperature is lowered, the bonding time increases. For example, to achieve a Al—Ge bond at a bonding temperature of 420° C., the bonding time would be between 20 minutes to 30 minutes and the applied pressure would be around 12 MPa. Presented below are examples of Al—Ge bonds that were obtained in lower bonding temperatures (>400° C.).

EXAMPLE 1

Figure 3A:
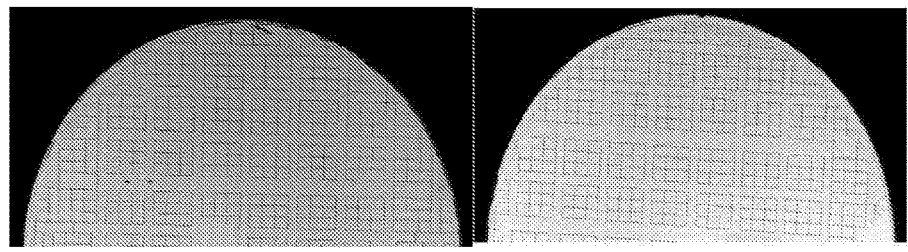
FIG. 3(a) is a screen-shot of a C-mode scanning acoustic microscopy (C-SAM) of a Al and Ge bonding achieved at a temperature of 350° C., a bonding time of around 60 minutes and an applied pressure of around 18 MPa.

A Al—Ge bond can be achieved at a bonding temperature of 350° C. The bonding time would be around 60 minutes and the applied pressure would be around 18 MPa. FIG. 3(a) is a screen-shot of a C-mode scanning acoustic microscopy (C-SAM) of a Al—Ge bonding achieved at a temperature of 350° C., a bonding time of around 60 minutes and an applied pressure of around 18 MPa. The absence of any gray areas within the bonded patterns as per FIG. 3(a) indicates that the Al—Ge bond has no leakage. Bonding strength was also confirmed by wafer thinning to 300 μm and dicing. A 100% yield was achieved by dicing. A diffused Al—Ge joint was also observed at the interface. It was observed that the Al—Ge bonding could be achieved well below the eutectic temperature without compromising the bonding quality if the non-uniformity of the metal deposition on exposed layer 102 and exposed layer 104 is controlled within 3%. Therefore, a sputtering mode of depositing Ge and Al to create exposed layer 102 and exposed layer 104 is preferred for low temperature Al—Ge bonding, due to better uniformity within a wafer. This sputtering technique would be superior in achieving uniformity within a wafer compared to other deposition modes such as evaporator or plating.

EXAMPLE 2

Figure 3B:
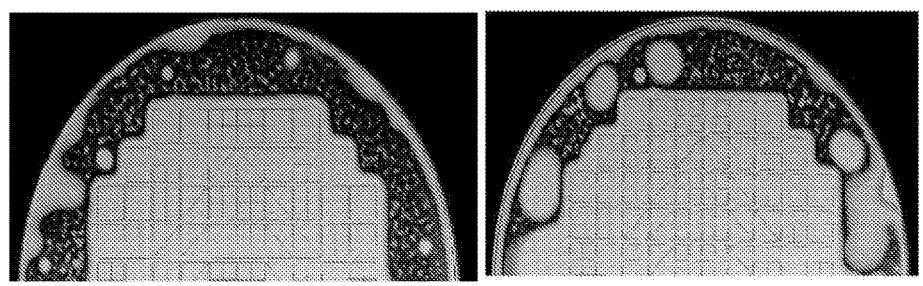
FIG. 3(b) is a screen-shot of a C-mode scanning acoustic microscopy (C-SAM) of a Al—Ge bonding achieved at a temperature of 300° C. and a bonding time of around 90 minutes.

A Al—Ge bond can also be achieved at a bonding temperature of 300° C. The bonding time would be around 90 minutes. FIG. 3(b) is a screen-shot of a C-mode scanning acoustic microscopy (C-SAM) of a Al—Ge bonding achieved at a temperature of 300° C. and a bonding time of around 90 minutes. No major water leakage was detected. The bonding strength of the Al—Ge bond was verified by wafer thinning and dicing. No delamination was observed and 100% dicing yield was achieved. However, the bonding time had to be around 90 minutes. Good bond quality could not be achieved at a bonding temperature of 300° C. and a bonding time of between 30 to 60 minutes. A bonding temperature of 300° C. required a bonding time of around 90 minutes. Therefore, bonding temperature and bonding time have an inversely proportional relationship i.e. if the bonding temperature is reduced, the bonding time would be increased. A prolonged bonding time may not be ideal for mass production. However, when it comes to temperature sensitive devices, a low bonding temperature would usually be the key consideration and not the prolonged bonding time.

EXAMPLE 3

Figure 3C:
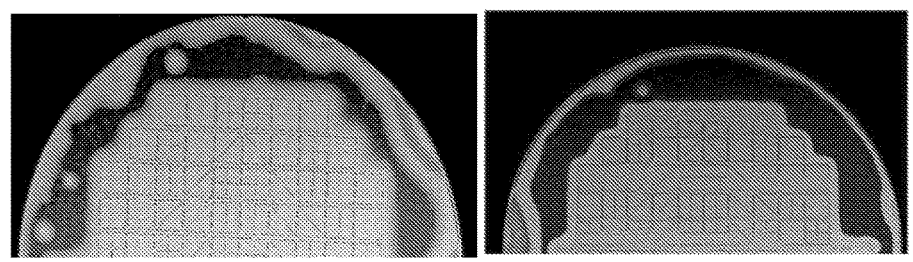
FIG. 3(c) is a screen-shot of a C-mode scanning acoustic microscopy (C-SAM) of a Al—Ge bonding achieved at a temperature of 250° C. and a bonding time of around 120 minutes.

A Al—Ge bond can also be achieved at a bonding temperature of 250° C. However, a bonding time of 90 minutes is not sufficient and the bonding time had to be extended to 120 minutes. FIG. 3(c) is a screen-shot of a C-mode scanning acoustic microscopy (C-SAM) of a Al—Ge bonding achieved at a temperature of 250° C. and a bonding time of around 120 minutes. Further reduction of bonding temperature (below 250° C.) is feasible but at the cost of a prolonged and perhaps impractical bonding time. If further reduction of bonding temperature is desired, it is also advisable to perform thermal aging for extended hours after bonding Further reduction of bonding temperature (below 250° C.) is feasible but it may not be productive since the throughput will be compromised as it may require longer bonding times.

Figure 4A:
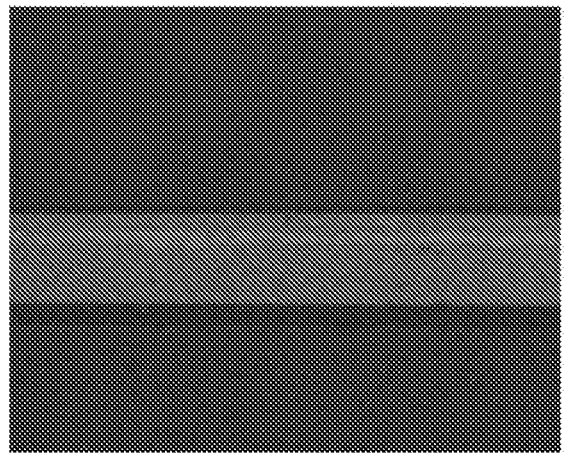
FIG. 4(a) shows the microstructure of a bond or joint as a result of Al—Ge bonding at a bonding temperature of 350° C.
Figure 4B:
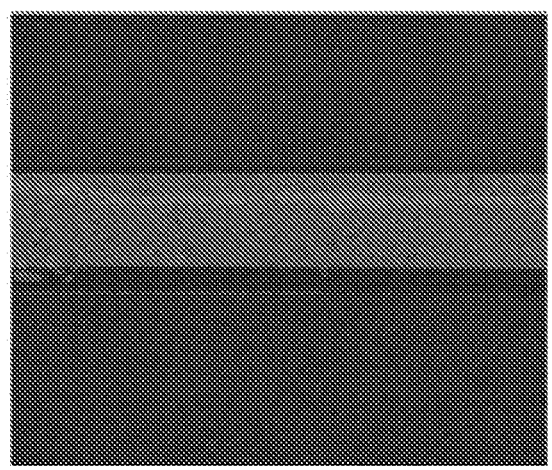
FIG. 4(b) shows the microstructure of a bond or joint as a result of Al—Ge bonding at a bonding temperature of 300° C.
Figure 5:
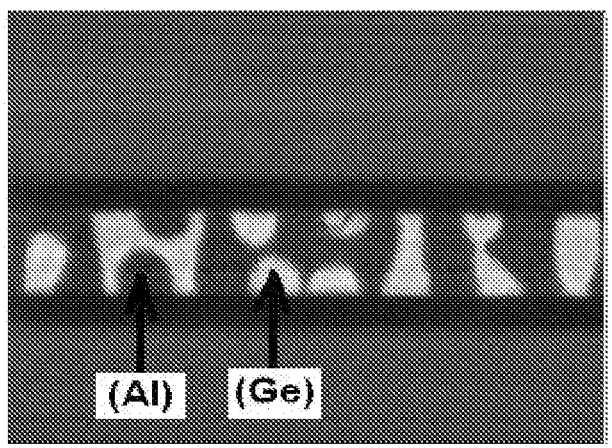
FIG. 5 shows the bond microstructure obtained by Al—Ge eutectic bonding at the eutectic temperature.

The solid-state diffusion bonds achieved by low temperature Al—Ge bonding as described are comparable to the bonds achieved by eutectic bonding. FIG. 4(a) shows the microstructure of a bond or joint as a result of Al—Ge bonding at a bonding temperature of 350° C. FIG. 4(b) shows the microstructure of a bond or joint as a result of Al—Ge bonding at a bonding temperature of 300° C. The bonds achieved by low temperature Al—Ge bonding, as shown in FIG. 4(a) and FIG. 4(b), have a highly diffused zone. This is because solidification does not occur during low temperature bonding since there is no actual melting. Hence, low temperature Al—Ge bonding does not suffer from solidification defects and metal splashing. Further, in low temperature bonding, the Al and Ge phases could not be distinguished which indicates good solubility of Ge in the (Al) phase. In contrast, in the bond microstructure obtained by Al—Ge eutectic bonding, the Al and Ge phases can be easily distinguished as shown in FIG. 5. There was also no major difference in the microstructure of the diffused zone when the bonding temperature was 350° C. and when the bonding temperature was 300° C. However, it was observed that higher bonding temperatures did result in thicker diffused zones.

Low temperature bonding is an attractive wafer bonding option because of its low stress, lower thermal damage and lower process cost (as the bonding temperature is lower). Through the examples, it has been demonstrated that Al—Ge bonding can be achieved well below the eutectic melting point (i.e. 400° C.), has good bond quality and excellent dicing yield. However, low temperature bonding does have one trade-off, in that it is not ideal for wafers with high topography. Wafers with high topography are wafers with surfaces that are irregular and contoured. In low temperature bonding, the metals (Al and Ge) do not actually melt into the molten state, but remain in the solid state even at bonding temperature. As there is no molten metal to deform and planarize and essentially fill the contours of the irregular surfaces of the wafers, the adhesion of the Al—Ge bond to the high topography wafers will be compromised. Furthermore, Ge is a hard metal and does not deform and planarize. Therefore, even though Ge is compatible with Complementary metal-oxide semiconductors (CMOS), the properties of Ge limit the applicability of Al—Ge bonding.

Figure 6A:
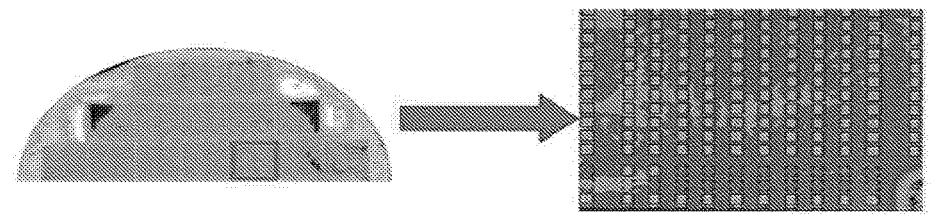
FIG. 6(a) shows a through-scan and a C-SAM analysis of a Al—Ge eutectic bonded wafer with high topography subjected to a short bonding time and a medium-level pressure.
Figure 6B:
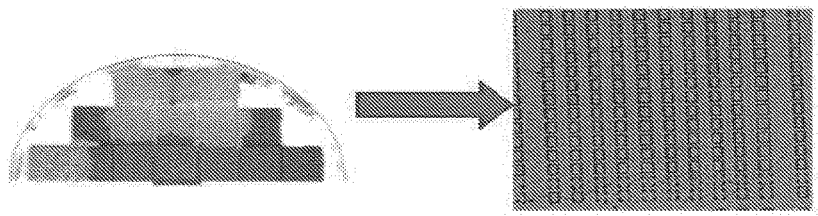
FIG. 6(b) shows a through-scan and a C-SAM analysis of a Al—Ge eutectic bonded wafer with high topography subjected to a longer bonding time and a higher-level pressure.
Figure 6C:
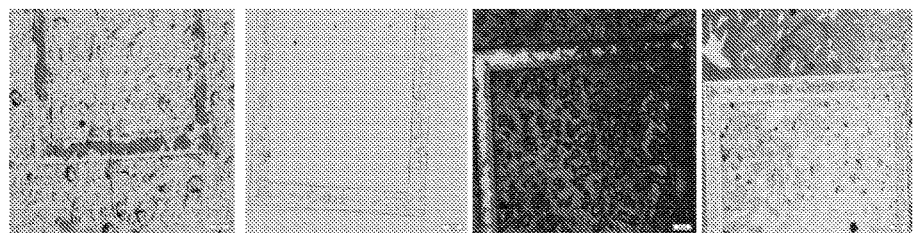
FIG. 6(c) shows optical images of delaminated dies where Al—Ge bonding was used to bond wafers with high topography.

In experiments, it was observed that Al—Ge bonding did not occur in the majority of the bonding area for wafers with high topography. FIG. 6(a) shows a through-scan and a C-SAM analysis of a Al—Ge eutectic bonded wafer with high topography subjected to a short bonding time and a medium-level pressure. FIG. 6(b) shows a through-scan and a C-SAM analysis of a Al—Ge eutectic bonded wafer with high topography subjected to a longer bonding time and a higher-level pressure. FIG. 6(a) indicates that Al—Ge eutectic bonding is unsuitable for wafers with high topography as bonding did not occur in the majority of the bonding area. FIG. 6(b) indicates that increasing the bonding time and pressure level improved the bonding quality as the bonding area increased. However, the improvement still fell short as the bonding quality remained inadequate. Tests reveal that the bonded wafer delaminated during wafer thinning. The dicing yield of the as-bonded pair was too low. Majority of the bonded dies delaminated during dicing, indicating that the bonding strength was inadequate. FIG. 6(c) shows optical images of delaminated dies where Al—Ge bonding was used to bond wafers with high topography. The optical images of FIG. 6(c) show that bonding did not occur uniformly. Bonding had only been initiated in a few regions of the sealing ring despite holding the wafers with bonding rings at the eutectic bonding temperature under high pressure for extended periods. Therefore, there exists a need to make low temperature Al—Ge bonding and Al—Ge eutectic bonding suitable for wafers with high topography.

Figure 7:
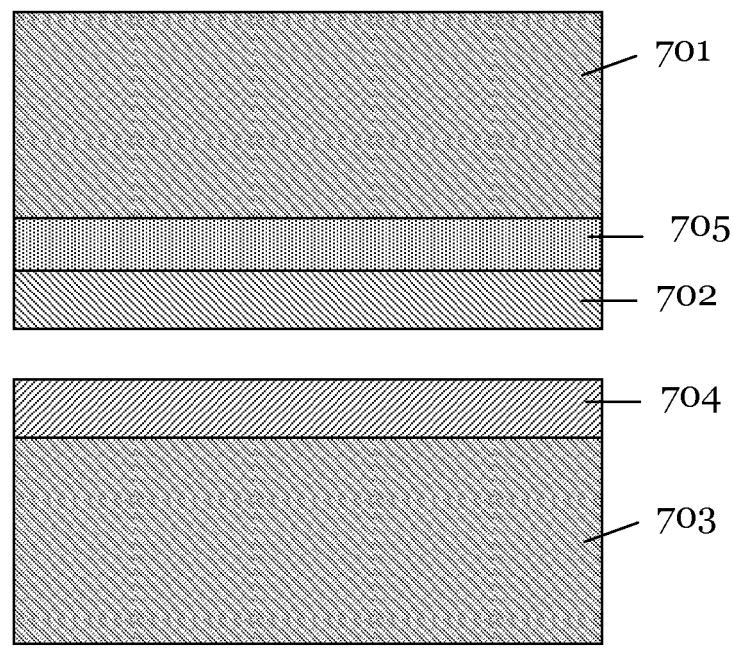
FIG. 7 is a cross-sectional view of an embodiment of two discrete silicon wafers just prior to bonding or assembly, with one of the silicon wafers having a cushioning layer.

To address the above mentioned problem, a cushioning layer is added to the silicon wafer in an embodiment of the invention. FIG. 7 is a cross-sectional view of an embodiment of two discrete silicon wafers just prior to bonding or assembly, with one of the silicon wafers having a cushioning layer. In FIG. 7, silicon wafer 701 has Ge layer 702 and silicon wafer 703 has Al layer 704. Silicon wafer 701 has cushioning layer 705. Preferably, cushioning layer 705 is adjacent to Ge layer 702. Preferably, cushioning layer 705 is sandwiched between silicon wafer 701 and Ge layer 702 such that Ge layer 702 is exposed as depicted in FIG. 7. Preferably, cushioning layer 705 is made up of a soft metal like Copper (Cu) or Al.

Figure 8:
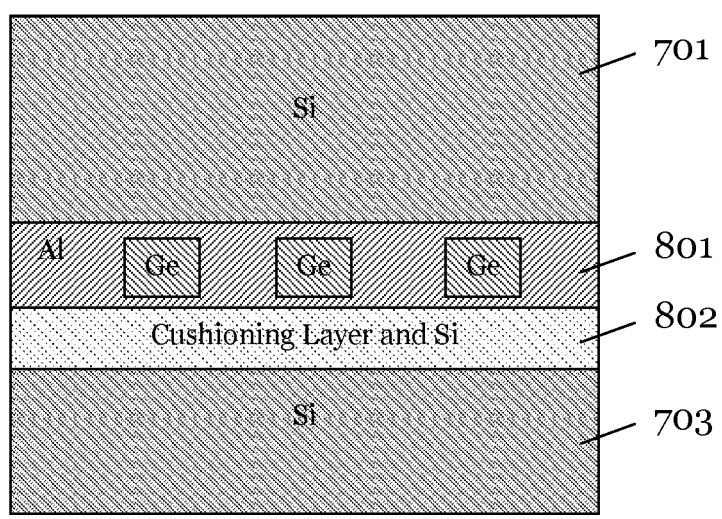
FIG. 8 is a cross-sectional view of the assembly after the bonding of the two discrete silicon wafers.

Cushioning layer 705 serves a variety of purposes. Firstly, cushioning layer 705 helps to buffer or cushion silicon wafer 701 when it is subjected to the high pressure during the bonding process. Further, when high pressure is applied to compress silicon wafer 701 and silicon wafer 703, cushioning layer 705 deforms and absorbs the surface non-planarities of silicon wafer 703. FIG. 8 is a cross-sectional view of the assembly after the bonding of the two discrete silicon wafers, silicon wafer 701 and silicon wafer 703. Ge layer 702 and Al layer 704 have bonded to form Al—Ge bond 801. Cushioning layer 705 has deformed and diffused through Al—Ge bond 801 to form diffused layer 802 with the contours or irregular surface of silicon wafer 703.

Figure 9A:
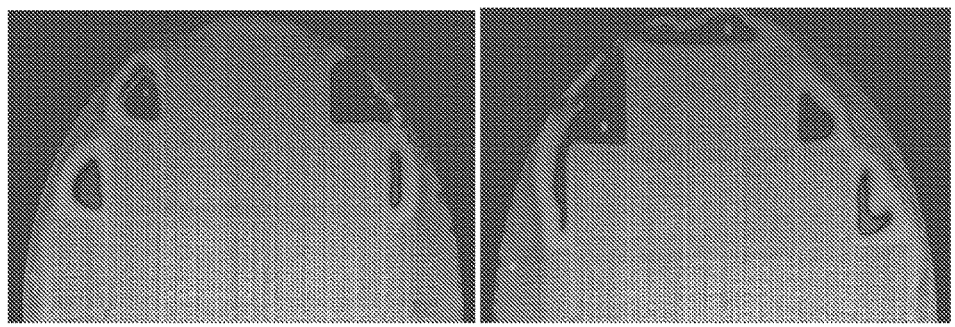
FIG. 9(a) shows a C-SAM analysis confirming good Al—Ge bond quality for wafers with high topography using cushioning layer beneath Ge layer.
Figure 9B:
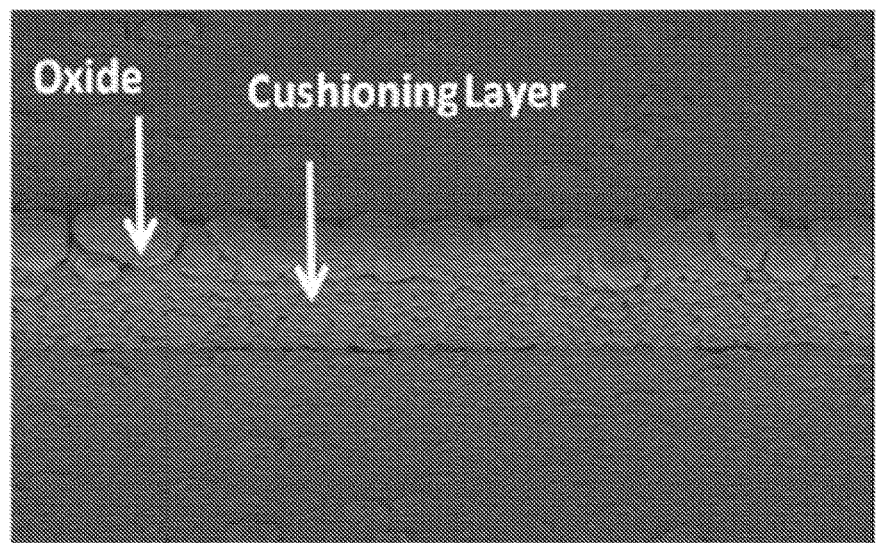
FIG. 9(b) shows the fine texture requirement of the cushioning layer.

FIG. 9(a) shows a C-SAM analysis confirming good Al—Ge bond quality for wafers with high topography using cushioning layer beneath Ge layer. Tests indicate that wafer level Al—Ge hermetic bonding was achieved. This is reaffirmed by the C-SAM analysis as shown in FIG. 9(a). No leakage was detected. No wafer delamination was observed despite wafer thing to 100 μm. 100% bonding yield was achieved. Therefore, the results indicate that Al—Ge bonding at low temperatures can be extended to high topography wafers by incorporating a cushioning layer. Similarly, incorporating a cushioning layer also allows Al—Ge eutectic bonding to cater to high topography wafers. FIG. 9(b) shows the fine texture requirement of cushioning layer 705. Preferably, cushioning layer 705 should be of fine texture. Preferably, cushioning layer 705 should be able to deform and trace the contours or irregular surface of a silicon wafer. Preferably, cushioning layer 705 should interact with Ge layer 702 and silicon wafer 703 to form the minimum required reaction zone in order to ensure good adhesion.

Transient liquid phase (TLP) bonding is also commonly used for bonding non-planar wafers. TLS bonding differs from diffusion bonding in that a melting point depressant element from an interlayer moves into lattice and grain boundaries of the substrates at the bonding temperature. Solid state diffusional processes lead to a change of composition at the bond interface and the dissimilar interlayer melts at a lower temperature than the parent materials. Thus a thin layer of liquid spreads along the interface to form a joint at a lower temperature than the melting point of either of the parent materials. Therefore, as the interlayer literally melts into a molten state, TLP bonding is very suitable for non-planar wafers as the molten interlayer can compensate for the contours and irregular surfaces of the wafer. The interlayers are commonly made up of Tin (Sn) or Indium (In). The interlayers react with the parent materials, for example Gold (Au) or Copper (Cu) to form Au—Sn intermetallic compounds or Cu—Sn intermetallic compounds.

The melting point of the In interlayer is 156° C. and the TLP bonding temperature involving In is around 180° C. to 225° C. The melting point of the Sn interlayer is 232° C. and the TLP bonding temperature involving Sn is around 250° C. to 285° C. The minimum required getter activation temperature for vacuum sealing is 350° C. As the minimum required getter activation temperature for vacuum sealing will not be reached during TLP bonding for either In or Sn, therefore getter activation is not possible during TLP bonding. Getter activation could be done after bonding. However, the performance of the getter and the getter lifetime may be compromised.

One consideration for getter activation would be to use Al—Ge eutectic bonding due to the eutectic temperature (around 400° C.) being higher than the TLP bonding temperature, and exceeding the getter activation temperature. However, Al—Ge eutectic bonding cannot be used for wafers with high topography as both Al and Ge do not melt during bonding, and are predominantly in the solid state, since non-equilibrium conditions (i.e. high bonding pressure) prevail during Al—Ge wafer level bonding. One would then consider a solution of combining TLP bonding (to address the non-planar surfaces of the wafers) with Al—Ge eutectic bonding. However, as the re-melting temperature of Au—Sn intermetallic compounds is less than 400° C. while the re-melting temperature of Cu—Sn intermetallic compounds is around 400° C., heating the assembly to the eutectic temperature of 400° C. would result in the melting of the intermetallic compounds. As such, this is not a desirable approach.

Figure 10:
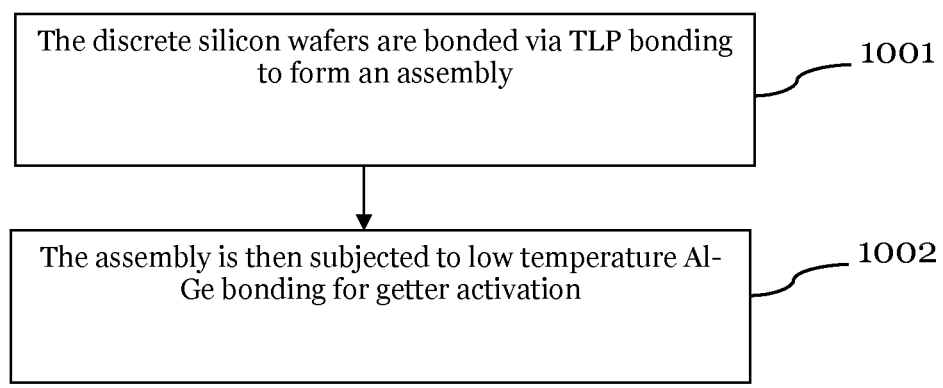
FIG. 10 is a flow chart of a method for combining TLP bonding with the low temperature bonding in accordance with an embodiment of the present invention.
Figure 11A:
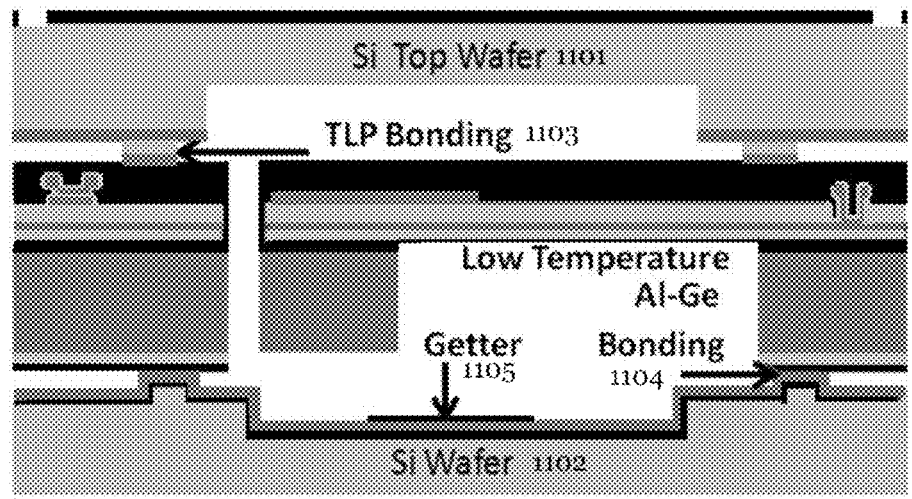
Figure 11B:
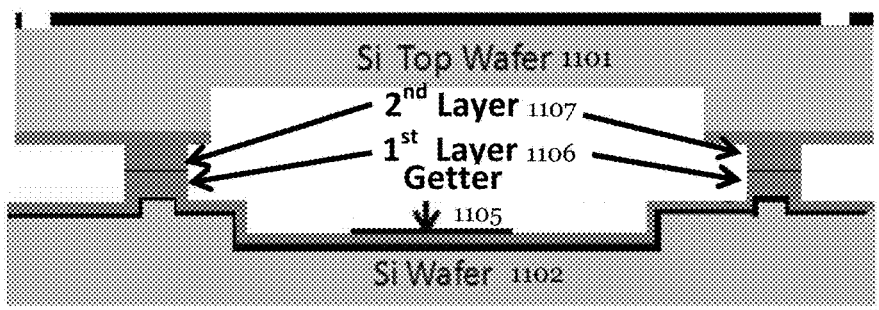
Figure 11C:
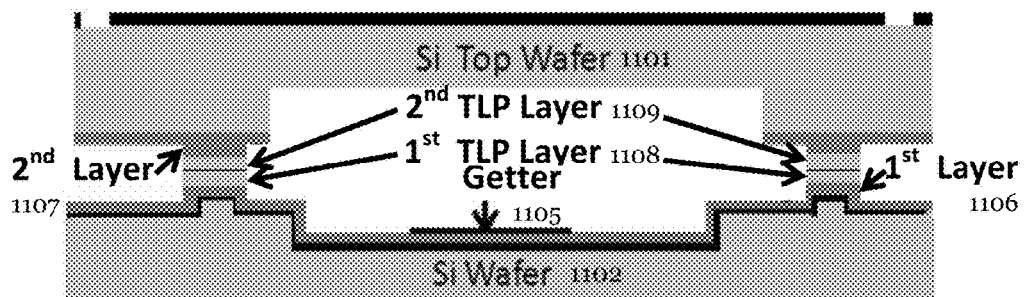

A solution for high topography wafers which require getter activation is provided by combining TLP bonding with the low temperature Al—Ge bonding in accordance with an embodiment of the present invention. This is illustrated in FIG. 10. In step 1001, the discrete silicon wafers are bonded via TLP bonding to form an assembly. TLP bonding involves a low melting interlayer and a high melting parent metal. Bonding temperature is above the melting point of the interlayer. At the bonding temperature, the low melting interlayer melts and reacts with the parent metal which is in the solid state, resulting in the formation of the intermetallic compounds. Because the interlayer melts into a molten state, TLP bonding helps to compensate for the irregular surfaces of the silicon wafers. In step 1002, the assembly is then subjected to low temperature Al—Ge bonding as taught in embodiments of the present invention for getter activation. As low temperature Al—Ge bonding can operate at a temperature range which exceeds the minimum required getter activation temperature (350° C.) but less than the re-melting temperature of the intermetallic compounds (around 400° C.) of the TLP bond, therefore low temperature Al—Ge bonding can ensure getter activation while not causing the intermetallic compounds of the TLP bond to melt. FIG. 11A is a cross-sectional view of the assembly including with two substrates and an interposer substrate after TLP bonding and low temperature Al—Ge bonding. Silicon top wafer 1101 and silicon wafer 1102 are bonded by TLP bonding 1103 and low temperature Al—Ge bonding 1104. FIG. 11B is a cross-sectional view of the assembly including the silicon top wafer 1101 and the silicon wager 1102 bonded directly together by low-temperature Al—Ge bonding wherein a first exposed layer 1106 on a first substrate (the silicon wafer 1102) is directly contacted with a second exposed layer 1107 on a second substrate (the silicon top wafer 1101) to form a solid-state diffusion bond. And FIG. 11C is cross-sectional view of the assembly including the silicon top wafer 1101 and the silicon wafer 1102 bonded directly together by TLP bonding wherein a first TLP layer 1108 on a first substrate (the silicon wafer 1102) is bonded with a second TLP layer 1109 on a second substrate (the silicon top wafer 1101) to form intermetallic compounds. All three assemblies also have getter 1105.

Figure 12:
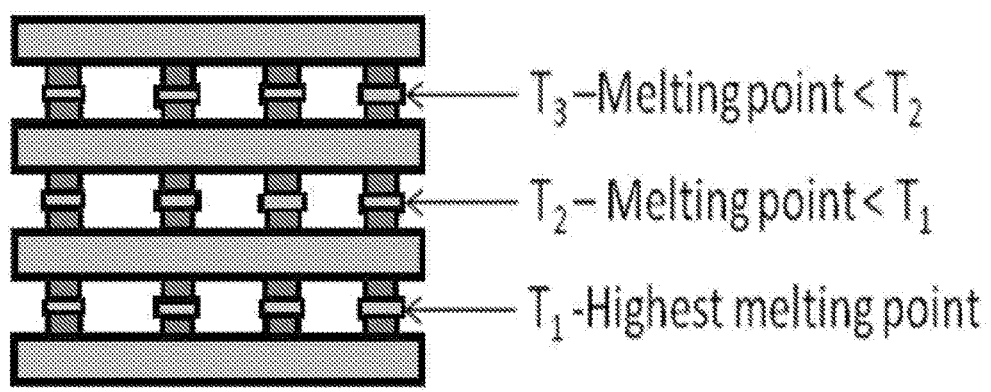
FIG. 12 is a diagram depicting solder metals requiring varying melting points for multi-chip stacking.

For multi-chip stacking, the melting behavior is important. The solder design for high temperature applications need to consider the appropriate regime of melting temperatures because the soldered parts cannot be allowed to melt until the last step of the assembling process. The solidus (temperature at which melting of a substance begins) temperature of the solder used in the first level packaging should be at least 50° C. higher than the melting point of the solder used in the second level packaging in order to withstand peak temperatures of the second level soldering. This is illustrated in FIG. 12 where the solder used in the first level packaging has a solidus temperature T1, the solder used in the second level packaging has a solidus temperature T2, and the solder used in the third level packaging has a solidus temperature T3, and T1>T2>T3. It is therefore tedious to select and organize different solder metals with varying melting points for multi-chip stacking.

TLP bonding could be used for the soldering as the re-melting temperature of the intermetallic compounds is higher than the TLP bonding temperature. However, the downside is that the interlayer has to be fully converted into the intermetallic compounds. Furthermore, the intermetallic compounds formed as a result of the TLP bonding are brittle in nature. As the intermetallic compounds will be heated repeatedly during the assembling process, there is therefore a reliability concern in the use of TLP bonding in multi-chip stacking.

Using low temperature Al—Ge bonding to solder chips together during multi-chip stacking can alleviate the above concerns. This is because low temperature Al—Ge bonding operates at a lower temperature range than the re-melting temperature of intermetallic compounds but yet retains good bond quality.

Figure 13:
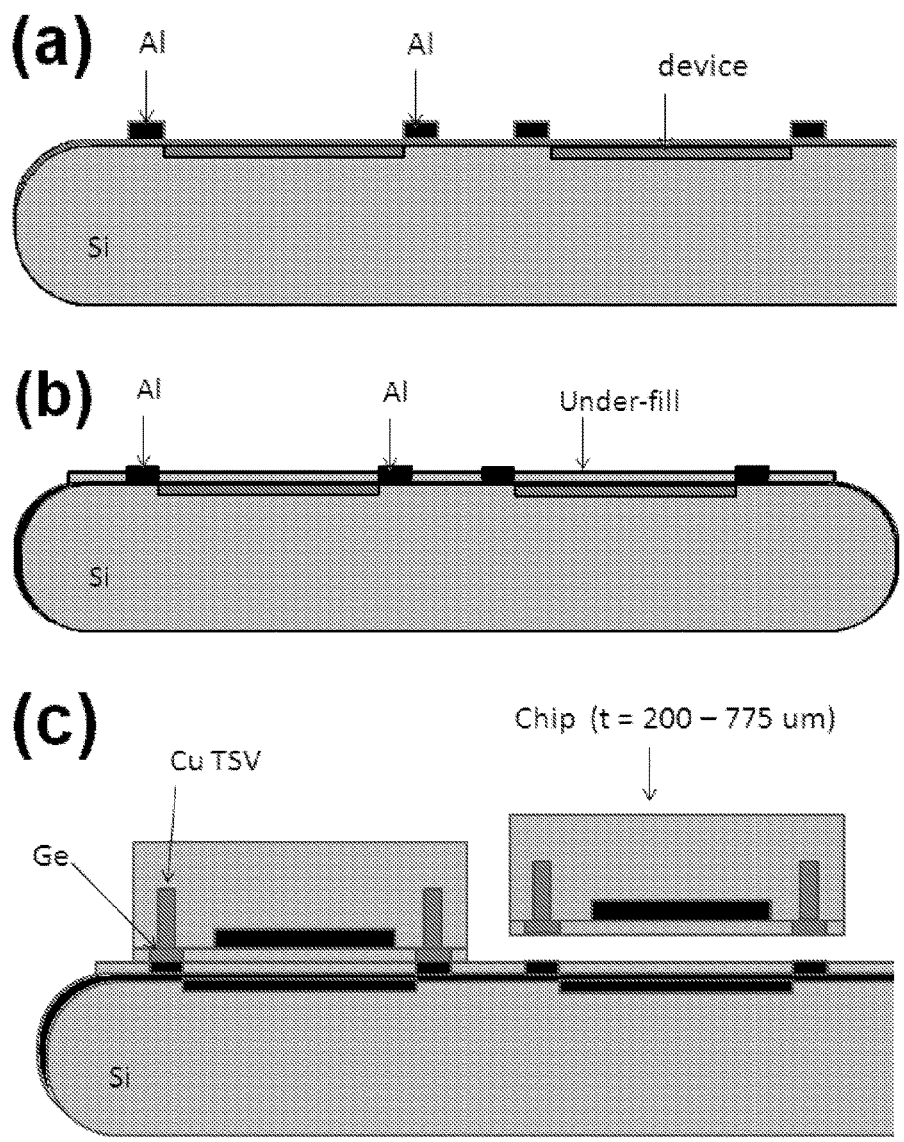
FIGS. 13(a)-(f) is a series of figures that illustrates the process of multi-chip stacking using low temperature Al—Ge bonding in accordance with an embodiment of the present invention.
Figure 13:
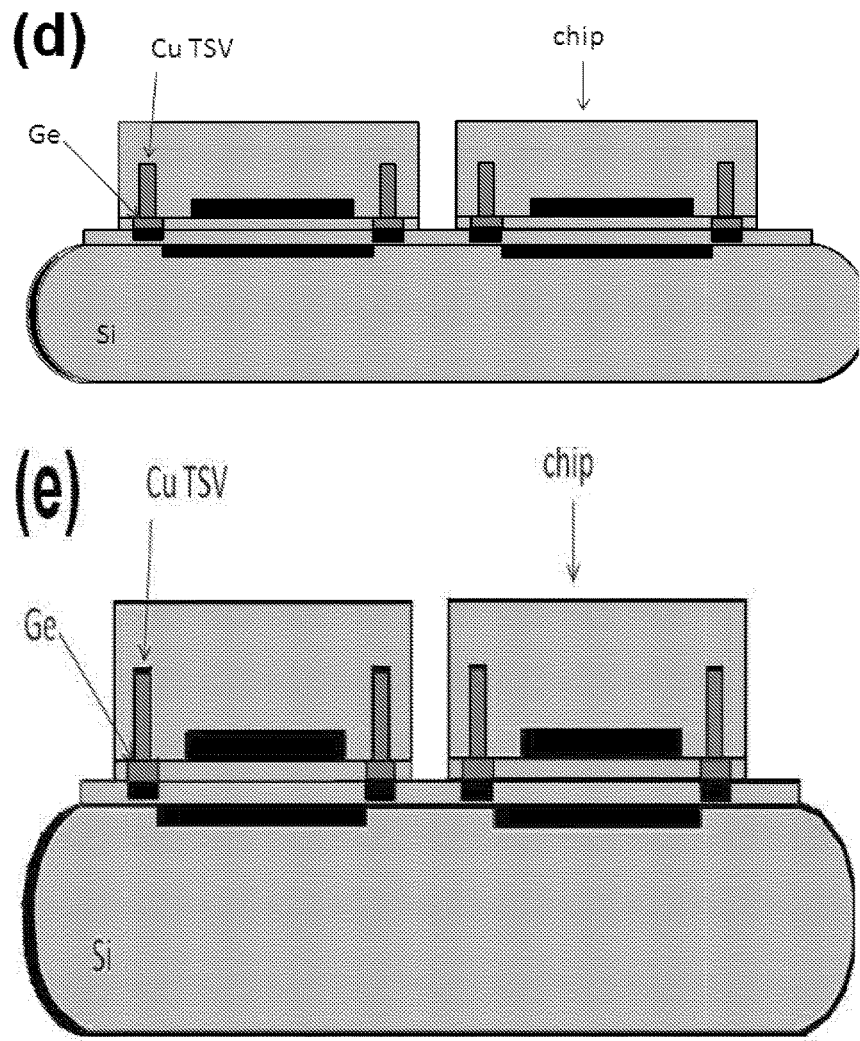
Figure 13:
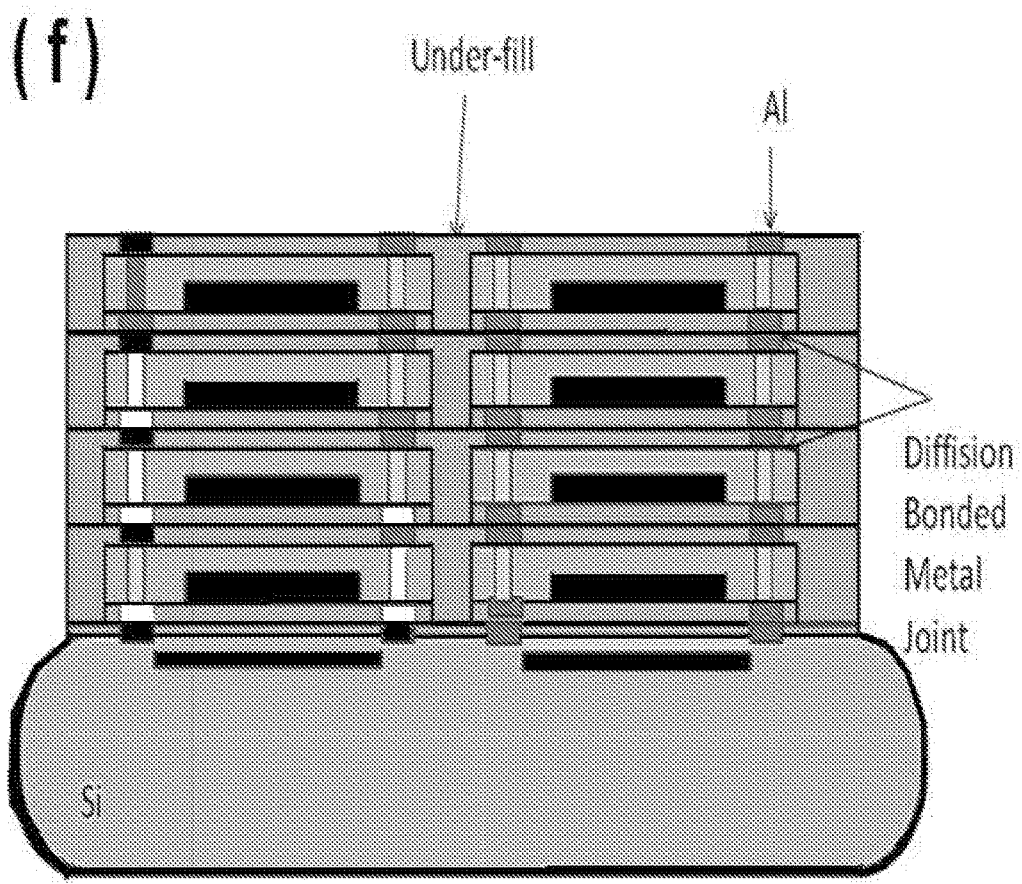

FIGS. 13(a)-(f) is a series of figures that illustrates the process of multi-chip stacking using low temperature Al—Ge bonding in accordance with an embodiment of the invention. FIG. 13(a) depicts Al pillars fabricated on the top surface of a device. FIG. 13(b) depicts underfill that have been dispensed to planarize the top surface of the device. FIG. 13(c) depicts chips with Ge pillars flip chip bonded to the Al pillars on the top surface of the device. Low temperature Al—Ge bonding as taught in this document is used to bond the Al pillars to the Ge pillars. Preferably, inductive bonding is used to implement the low temperature Al—Ge bonding. FIG. 13(d) depicts other chips having Ge pillars being gang bonded to the device for tacking purposes and to complete the second level packaging. FIG. 13(e) depicts application of mold or underfill followed by backside grinding to make the top surface of the second level packaging ready to receive chips. Al pillars are fabricated on the top surface of the second level packaging, ready to be flip chip bonded to chips with Ge pillars and the cycle repeats itself to stack multiple layers of chips. FIG. 13(f) depicts the stacked multi-chip assembly.

Figure 14:
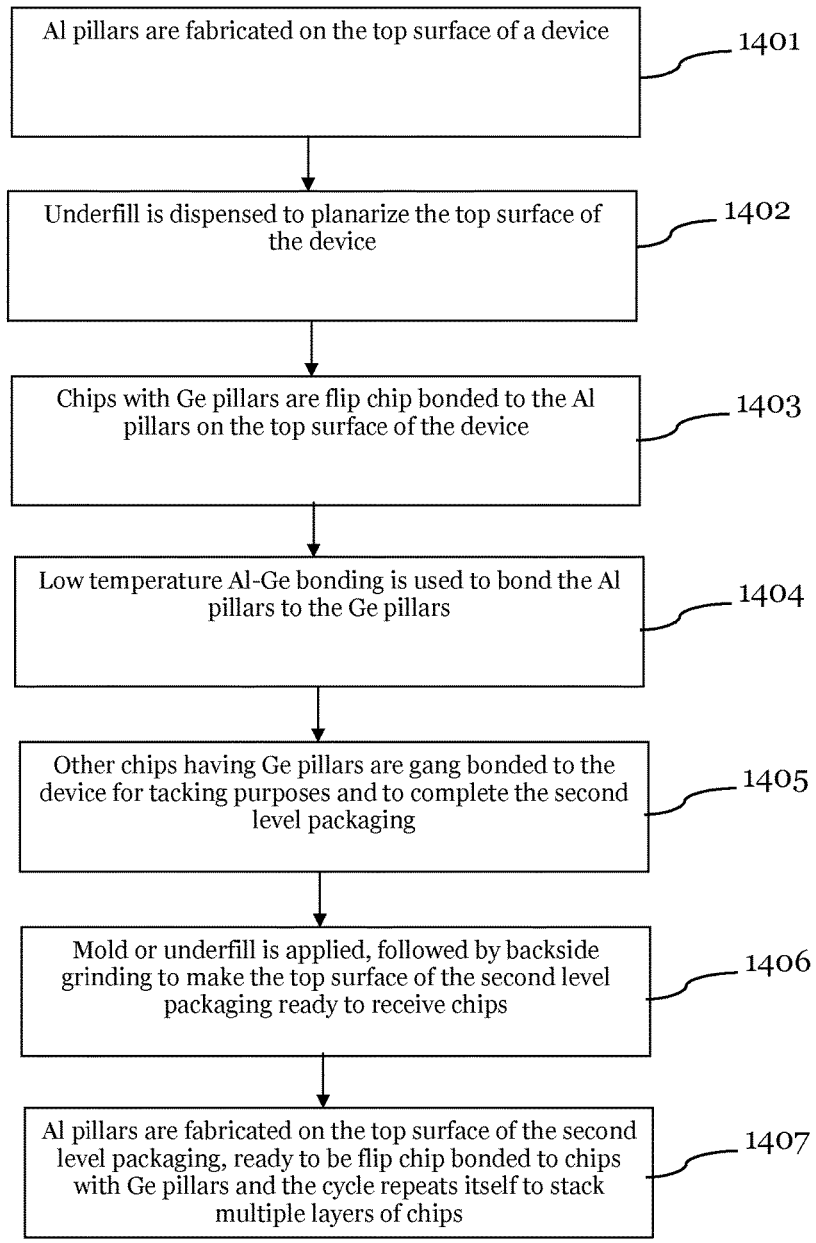
FIG. 14 is a flow chart of a process for multi-chip stacking using low temperature Al—Ge bonding in accordance with an embodiment of the present invention.

FIG. 14 is a flow chart of a process for multi-chip stacking using low temperature Al—Ge bonding in accordance with an embodiment of the invention. In step 1401, Al pillars are fabricated on the top surface of a device. In step 1402, underfill is dispensed to planarize the top surface of the device. In step 1403, chips with Ge pillars are flip chip bonded to the Al pillars on the top surface of the device. In step 1404, low temperature Al—Ge bonding is used to bond the Al pillars to the Ge pillars. Preferably, a single step inductive heating to the required Al—Ge bonding temperature is used. The advantage garnered is that only the metal traces are heated. Preferably, the low temperature Al—Ge bonding is performed in an oven and the required pressure is applied by pressurized gas. The advantage garnered is that no solidification occurs. Therefore, all the solidification related defects and issues can be mitigated which greatly improves alignment accuracy. These defects include microsegregation and the movement of components during solidification. In step 1405, other chips having Ge pillars are gang bonded to the device for tacking purposes and to complete the second level packaging. In step 1406, mold or underfill is applied, followed by backside grinding to make the top surface of the second level packaging ready to receive chips. In step 1407, Al pillars are fabricated on the top surface of the second level packaging, ready to be flip chip bonded to chips with Ge pillars and the cycle repeats itself to stack multiple layers of chips.

Alternatively, the bonding of the Al pillars to Ge pillars can be achieved by other types of solid state diffusion bonding such as fusion bonding or ultrasonic bonding, and does not need to be limited to low temperature Al—Ge bonding.

The low temperature Al—Ge bonding as described herein confers many advantages. It can used be for all MEMS devices, and this includes temperature sensitive devices, and even for devices having micro-scale film thickness. Further, it ensures better bond quality and dicing yield. It can also be combined with TLP bonding for getter activation and can be applied to multi-chip stacking. Furthermore, low temperature Al—Ge bonding has many other industrial applications and can be applied to MEMS hermetic sealing and vacuum packing, photonics packaging, rugged electronics packaging, and specifically suited for optical packaging and 3D stacking. Although the trade-off is that low temperature Al—Ge bonding requires a longer bonding time (when compared to eutectic bonding), its advantages as aforementioned greatly outweighs the trade-off.

It should further be appreciated that the exemplary embodiments are only examples, and are not intended to limit the scope, applicability, operation, or configuration of the invention in any way. Rather, the foregoing detailed description will provide those skilled in the art with a convenient road map for implementing an exemplary embodiment of the invention, it being understood that various changes may be made in the function and arrangement of elements and method of operation described in an exemplary embodiment without departing from the scope of the invention as set forth in the appended claims.

The invention claimed is:

1. A method for bonding wafers comprising the steps of:
providing a first wafer having an exposed first layer, the first layer comprising a first metal;
providing a second wafer having an exposed second layer, the second layer comprising a second metal, the first metal and the second metal capable of forming a eutectic mixture having a eutectic melting temperature;
contacting the first layer with the second layer; and
applying a predetermined pressure at a predetermined temperature to form a solid-state diffusion bond between the first layer and the second layer, wherein the predetermined temperature is below the eutectic melting temperature; and wherein the first metal is not deformable under the predetermined pressure and the second wafer further comprises an irregular surface, the method further comprising the step of:
providing a cushioning layer on the first wafer and adjacent to the first layer, the cushioning layer comprising a soft metal, wherein a melting point of the soft metal is above the predetermined temperature, and the soft metal is deformable under the predetermined pressure to diffuse through the solid-state diffusion bond and trace the contours of the irregular surface of the second wafer.

2. The method of claim 1 wherein the first metal is germanium and the second metal is aluminum.

3. The method of claim 1 wherein the soft metal is copper or aluminum.

4. The method of claim 1 wherein the predetermined temperature is less than 400° C.

5. The method of claim 4 wherein the predetermined temperature is within a range of 250° C. and 300° C.

6. The method of claim 1 further comprising the step of performing thermal aging after the formation of the solid-state diffusion bond.

7. The method of claim 1 wherein the predetermined pressure at the predetermined temperature is applied for any one of the following durations: 30 minutes, 60 minutes, 90 minutes and 120 minutes.

8. The method of claim 1 comprising the steps of sputtering the first metal on the first wafer to create the first layer and sputtering the second metal on the second wafer to create the second layer.

9. The method of claim 1 wherein the first metal and the second metal are dissimilar and the first metal and the second metal have substantially similar inter-diffusion coefficients.

10. A method for bonding wafers and initiating getter activation, the method comprising the steps of:
providing a first wafer having an exposed first layer, the first layer comprising a first metal;
providing a second wafer having an exposed second layer, the second layer comprising a second metal, the first metal and the second metal capable of forming a eutectic mixture having a eutectic melting temperature;
contacting the first layer with the second layer; and
applying a predetermined pressure at a predetermined temperature to form a solid-state diffusion bond between the first layer and the second layer, wherein the predetermined temperature is below the eutectic melting temperature and further comprising the steps of:
providing a first TLP (transient liquid phase) layer on the first wafer;
providing a second TLP layer on the second wafer; and
initiating TLP bonding between the first TLP layer and the second TLP layer to form intermetallic compounds;
wherein the predetermined temperature is below a melting temperature of the intermetallic compounds.

11. A method for stacking semiconductor devices comprising the steps of:
fabricating on a surface of a first semiconductor device, connectors comprising a first metal;
applying under-fill to planarize the surface of the first semiconductor device;
fabricating on a surface of a second semiconductor device, connectors comprising a second metal, the first metal and the second metal capable of forming a eutectic mixture having a eutectic melting temperature;

applying under-fill to planarize the surface of the second semiconductor device;

aligning and contacting the connectors on the surface of the first semiconductor device with the connectors on the surface of the second semiconductor device; and applying a predetermined pressure at a predetermined temperature to form a solid-state diffusion bond between the connectors on the surface of the first semiconductor device and the connectors on the surface of the second semiconductor device, wherein the predetermined temperature is below the eutectic melting temperature; and wherein the first metal is not deformable under the predetermined pressure and the second semiconductor further comprises an irregular surface, the method further comprising the step of:

providing cushioning layers on the first semiconductor device and each of the cushioning layers is adjacent to each of the connectors of the first semiconductor device, each of the cushioning layers comprising a soft metal, wherein a melting point of the soft metal is above the predetermined temperature, and the soft metal is deformable under the predetermined pressure to diffuse through the solid-state diffusion bond and trace the contours of the irregular surface of the second semiconductor.

12. The method of claim 11 wherein the predetermined pressure is applied using pressurized gas.

13. The method of claim 11 wherein the predetermined temperature is applied by heating the first semiconductor device and the second semiconductor device in an oven to the predetermined temperature.

14. The method of claim 11 wherein the first metal is germanium and the second metal is aluminum.

* * * * *